United States Patent
Caroselli et al.

(10) Patent No.: US 6,476,737 B1
(45) Date of Patent: Nov. 5, 2002

(54) RATE 64/65 (D=0, G=11/I=10) RUN LENGTH LIMITED MODULATION CODE

(75) Inventors: Joseph P. Caroselli, Palo Alto, CA (US); Shirish A. Altekar, Los Gatos, CA (US); Charles E. MacDonald, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/992,041

(22) Filed: Nov. 16, 2001

(51) Int. Cl.$^7$ ............................................. H03M 7/00
(52) U.S. Cl. ........................ 341/59; 341/58; 341/60; 341/61; 341/102; 341/103
(58) Field of Search ...................... 341/58, 59, 60, 341/61, 102, 103, 50–109; 375/261–262; 714/792, 795, 732, 755

(56) References Cited

U.S. PATENT DOCUMENTS

| | | | | |
|---|---|---|---|---|
| 4,872,166 A | * | 10/1989 | Jippo | 371/11.1 |
| 5,757,294 A | * | 5/1998 | Fisher et al. | 341/58 |
| 5,757,822 A | * | 5/1998 | Fisher et al. | 371/37.1 |
| 6,018,304 A | * | 1/2000 | Bessios | 341/58 |
| 6,097,320 A | * | 8/2000 | Kuki et al. | 341/58 |
| 6,204,781 B1 | * | 3/2001 | Aziz et al. | 341/59 |
| 6,299,458 B1 | * | 5/2001 | Altekar et al. | 341/59 |
| 6,265,994 B1 | * | 7/2001 | Kahlman | 341/58 |
| 6,285,302 B1 | * | 9/2001 | McClellan | 341/59 |

* cited by examiner

Primary Examiner—Michael Tokar
Assistant Examiner—Linh V Nguyen
(74) Attorney, Agent, or Firm—Suiter & Associates PC

(57) ABSTRACT

The present invention describes a system and method for encoding a sequence of 64 bit digital data words into a sequence of 65 bit codewords having constraints of (d=0, G=11/I=10) for recording upon a magnetic medium within a magnetic recording channel are disclosed. The method for encoding a sequence of 64 bit digital data words into a sequence of codewords having 65 bits, comprising the steps of dividing each 64-bit digital data word into 8-bit bytes, encoding two 8-bit bytes to form a 17-bit word, forming five 11-bit intermediate blocks from the 8-bit bytes, encoding the five 11-bit intermediate blocks, and concatenating the five encoded 11-bit intermediate blocks and uncoded and unconstrained bits from the 64 bit digital data word to form a 65 bit codeword. A corresponding decoding method is also described. A byte shuffler may be used in the processing.

30 Claims, 4 Drawing Sheets

| Bit | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|
| | 1 | 1 | 1 | X | X | X | X | X | X | X | X | X | X | X | X | X | X |
| | X | X | X | 1 | 1 | 1 | X | X | X | X | X | X | X | X | X | X | X |
| | X | X | X | X | X | X | 1 | 1 | 1 | X | X | X | X | X | X | X | X |
| | X | X | X | X | X | X | X | X | X | 1 | 1 | 1 | X | X | X | X | X |
| | X | X | X | X | X | X | X | X | X | X | X | X | 1 | 1 | 1 | X | X |

Table 1. Patterns forbidden by the 16/17 code.

FIG. 3

| q1 | q2 | q3 | q4 | y[16:14] | y[13:11] | y[10:8] | y[7:5] | y[4:2] | y[1:0] |
|---|---|---|---|---|---|---|---|---|---|
| 0 | 0 | 0 | 0 | x[15:13] | x[12:10] | x[9:7]  | x[6:4]  | x[3:2]0 | x[1:0] |
| 1 | 0 | 0 | 0 | x[6:4]   | x[12:10] | x[9:7]  | x[3:2]0 | 0 0 1   | x[1:0] |
| 0 | 1 | 0 | 0 | x[15:13] | x[6:4]   | x[9:7]  | x[3:2]0 | 0 1 1   | x[1:0] |
| 0 | 0 | 1 | 0 | x[15:13] | x[12:10] | x[6:4]  | x[3:2]0 | 1 0 1   | x[1:0] |
| 0 | 0 | 0 | 1 | x[15:13] | x[12:10] | x[9:7]  | x[12]x[12]1 | x[13]$\overline{x[13]}$1 | x[1:0] |
| 1 | 1 | 0 | 0 | x[9:7]   | x[6:4]   | x[3:2]0 | 0 0 1   | 0 0 1   | x[1:0] |
| 1 | 0 | 1 | 0 | x[15:13] | x[6:4]   | x[3:2]0 | 1 0 1   | 0 0 1   | x[1:0] |
| 0 | 1 | 1 | 0 | x[15:13] | x[12:10] | x[3:2]0 | 0 1 1   | 0 0 1   | x[1:0] |
| 0 | 0 | 1 | 1 | x[6:4]   | x[12:10] | x[3:2]0 | 0 0 1   | 1 0 1   | x[1:0] |
| 1 | 0 | 0 | 1 | x[15:13] | x[9:7]   | x[3:2]0 | 0 0 1   | 0 1 1   | x[1:0] |
| 0 | 1 | 0 | 1 | x[9:7]   | x[12:10] | x[12]x[12]1 | x[13]$\overline{x[13]}$1 | 0 0 1 | x[1:0] |
| 1 | 1 | 1 | 0 | x[6:4]   | x[3:2]0  | 0 0 1   | 0 0 1   | 0 0 1   | x[1:0] |
| 1 | 1 | 0 | 1 | x[9:7]   | x[3:2]0  | 0 1 1   | 0 0 1   | 0 0 1   | x[1:0] |
| 1 | 0 | 1 | 1 | x[12:10] | x[3:2]0  | 1 0 1   | 0 0 1   | 0 0 1   | x[1:0] |
| 0 | 1 | 1 | 1 | x[15:13] | x[3:2]0  | 0 0 1   | 0 1 1   | 0 0 1   | x[1:0] |
| 1 | 1 | 1 | 1 | x[3:2]0  | 0 0 1    | 0 0 1   | 0 0 1   | 0 0 1   | x[1:0] |

Table 2. Encoder mapping for 64/65 code.

FIG. 4

| Time | State | Output Byte Order | |
|------|-------|-------------------|---|
| 1 | 0 | 7 6 5 4 | 3 2 1 0 |
| 2 | 1 | 6 5 4 7 | 2 1 0 3 |
| 3 | 2 | 5 4 7 6 | 1 0 3 2 |
| 4 | 3 | 4 7 6 5 | 0 3 2 1 |
| 5 | 0 | 7 6 5 4 | 3 2 1 0 |
| ... | ... | ... | ... |

Table 3. Byte shuffling pattern used with 4-way interleaved ECC.

FIG. 5

| Time | State | Output Byte Order | |
|------|-------|-------------------|---|
| 1 | 0 | 7 6 5 4 | 3 2 1 0 |
| 2 | 1 | 4 7 6 5 | 0 3 2 1 |
| 3 | 2 | 5 4 7 6 | 1 0 3 2 |
| 4 | 3 | 6 5 4 7 | 2 1 0 3 |
| 5 | 0 | 7 6 5 4 | 3 2 1 0 |
| ... | ... | ... | ... |

Table 4. Byte deshuffling pattern used with 4-way interleaved ECC.

FIG. 6

RATE 64/65 (D=0, G=11/I=10) RUN LENGTH LIMITED MODULATION CODE

FIELD OF THE INVENTION

The present invention generally relates to the field of high rate codes, and particularly to run-length limited modulation codes.

BACKGROUND OF THE INVENTION

This invention relates to coding techniques for use with magnetic storage media.

Write and read channels for magnetic storage devices often employ encoding and decoding of the sequence of bits that is to be stored on the magnetic device. Encoding of the symbols to be recorded onto the magnetic storage media can be used to increase the noise tolerance of the entire system.

Encoding, however, comes at a cost in that it expands the number of bits required to store a fixed amount of user source data on the disk. The rate of a code indicates the relationship between the number of bits of user data encoded and the number of bits of encoded data stored on the storage media.

The central problem, therefore, for any designer involves a trade-off between the coding rate used and the density of storage that may be achieved using any particular code. A modulation code for a partial response maximum likelihood (PRML) data recording and playback channel is selected to balance efficiency and robustness against errors. The efficiency of a code is measured by a code rate k/n where k represents the number of user bits that are mapped into n recorded code bits by the encoder. Modulation codes with higher rates are deemed to be more efficient. Modulation codes which are more robust exclude more of the bit sequences that cannot be reliably detected. Thus, making the modulation code more robust results in a lower code rate. However, because detector performance can degrade with increasing channel densities, higher code rates are desirable.

Rate 8/9 (d=0, G=4/I=4) modulation codes have been used. Rate 16/17 (d=0, G=6/I=7) modulation codes have also been used. In the (d, G/I) run length limited (RLL) code constraints for use in magnetic recording of digital data in disk memory devices, parameters d and G are global constraints which represent the minimum and maximum of zero run lengths, respectively, in the interleaved code bit sequence.

The parameter I is the maximum interleave zero run length constraint. Because there may be consecutive 1s, the parameter d generally has a value of 0. A small value of G is desirable for accurate timing and gain recovery and control. These constraints must hold across codeword boundaries. Although described in terms of the (d, G/I) RLL code constraints for use in magnetic recording of digital data in disk memory devices, the code constraints and the apparatus for encoding and decoding data are applicable, however, to any PR signaling system employing ML detection.

Modulation codes have been employed within magnetic recording channels in order to achieve a more even distribution of magnetic flux transitions within a data track in view of data patterns of particular user information being encoded and recorded. In particular, RLL modulation codes have been employed within partial response, maximum likelihood sampling detection data recording and playback channels, as well as other detection channels.

A modulation code for a PRML data recording and playback channel is selected to impose certain signal playback conditions desired or needed to achieve robust and reliable data detection and to limit the span of information corrupted by errors in the recording/playback process, at the expense of some additional overhead information added to the coded data stream. The amount of additional overhead information directly relates to the rate (efficiency of the modulation code). The less overhead information added by the modulation code, the higher the rate or efficiency of the code. As efficiency increases less recording space is consumed by overhead information needed by the modulation code.

Magnetic storage systems typically include block memories and embedded control microprocessors. Currently, block memory arrays and control microprocessors used to handle data transfers within data storage systems are based upon 32 or 64 bit width bus architecture. As a consequence, the memory array's and the microprocessor's basic unit of data (data word) is 32 (or 64) bits.

Therefore, a hitherto unsolved need has remained for a very high rate modulation code for a magnetic recording channel which meets the foregoing requirements and solves the problems associated with the prior approaches.

There is a need for a high rate run-length limited modulation code with controlled error propagation.

SUMMARY OF THE INVENTION

Accordingly, the present invention is directed to a high rate run-length limited modulation code with controlled error propagation.

The invention presents a method for encoding a sequence of 64 bit digital data words into a sequence of codewords having 65 bits, comprising the steps of dividing each 64 bit digital data word into 8-bit bytes, encoding two 8-bit bytes to form a 17-bit word, forming five 11-bit intermediate blocks from the 8-bit bytes, encoding the five 11-bit intermediate blocks, and concatenating the five encoded 11-bit intermediate blocks and uncoded and unconstrained bits from the 64 bit digital data word to form a 65 bit codeword, wherein the 65-bit codeword satisfies a predetermined minimum zero run length (d) constraint, a predetermined maximum zero run length (G) constraint, and a predetermined maximum interleave zero run length (I) coding constraint.

The purpose of the code of the present invention is twofold. First, through the G constraint, the code ensures that a transition occurs relatively frequently. This ensures that the timing and gain loops get information on which to operate. Second, it limits the length of certain sequences that, when they occur in an error event, can extend the length of that event indefinitely if not kept in check. Both the G and I constraints limit these patterns which can result in quasi-catastrophic error events.

The present invention describes a method for decoding a sequence of 65 bit encoded codewords into a sequence of 64-bit digital data word bits, comprising the steps of dividing the 65-bit encoded codeword into 5 11-bit intermediate blocks and 2 2-bit and 2 3-bit blocks of unconstrained and uncoded bits; decoding the five 11-bit intermediate blocks separately; decoding 17 bits of the 65-bit codeword to form two 8-bit bytes; and dividing each of the remaining 48 bits from both the five 11-bit intermediate blocks and the unconstrained and uncoded bits into six 8-bit bytes.

It should be appreciated that the present invention can be implemented in numerous ways, including as a process, an apparatus, a system, a device, a method, or a computer readable medium such as a computer readable storage medium or a computer network wherein program instructions are sent over optical or electronic communication lines.

The present invention's 64/65 code provides a high rate. The present invention encodes 64 bit words, imparts (d=0, G=11/I=10) constraint onto data, and has manageable error propagation when used with 4-way interleave ECC and byte shuffling technique.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

FIG. 3 illustrates a table of forbidden bit patterns for a 17 bit codeword output from the 16/17 encoder.

FIG. 4 illustrates a table for the encoder mapping for 64/65 code.

FIG. 5 illustrates byte shuffling patterns used with 4-way interleaved ECC.

FIG. 6 illustrates byte deshuffling patterns used with 4-way interleaved ECC.

DETAILED DESCRIPTION OF THE INVENTION

Figure 1:
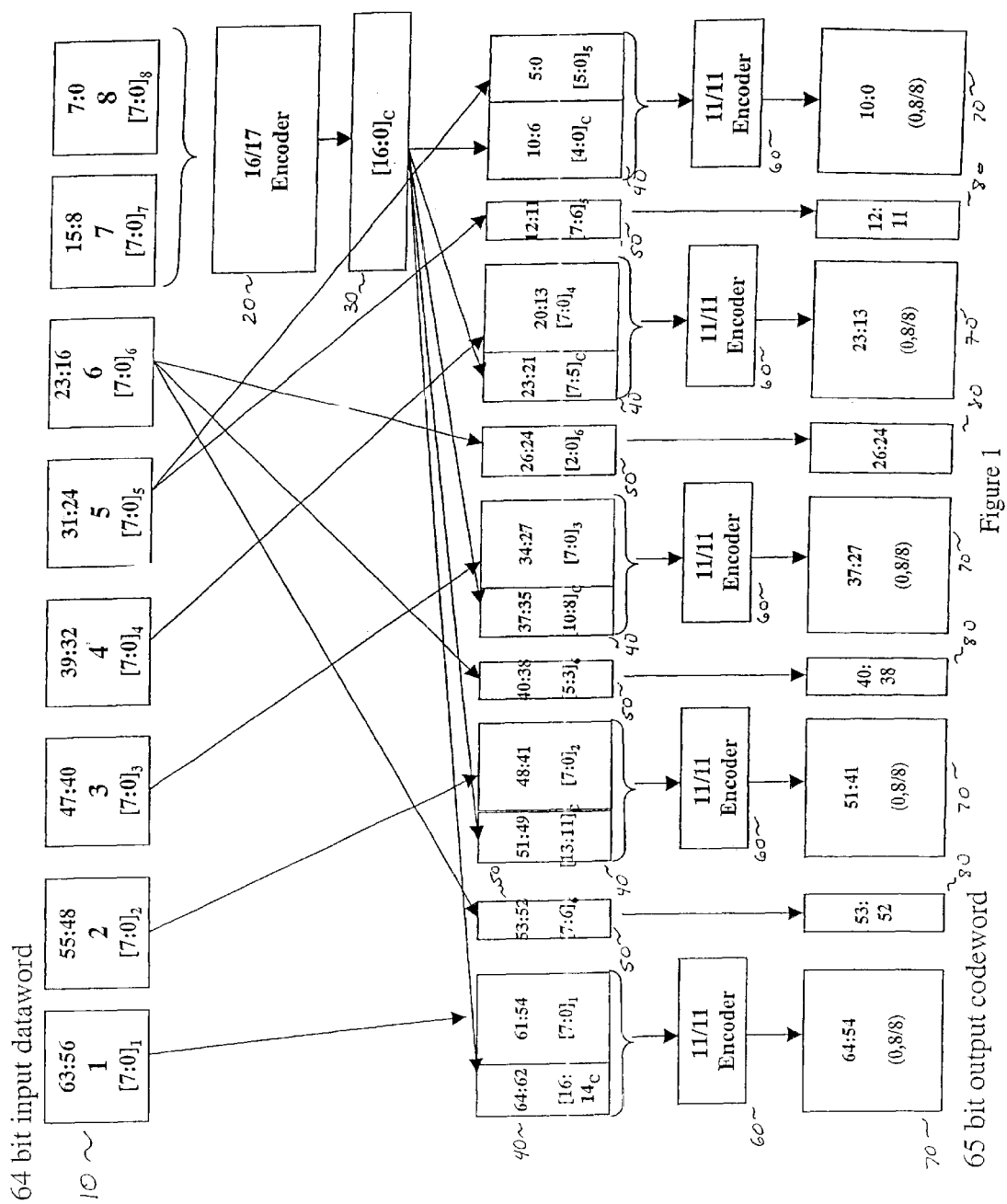
FIG. 1 illustrates a functional block diagram for a 64/65 encoder.

One purpose of a modulation code is to ensure that conditions imposed on the user information recorded data on a magnetic storage medium or optical recording system helps achieve desired data rates.

Maximum likelihood (ML) detection is typically used in partial response (PR) channels. Typically, for a given channel bandwidth, a PR signal permits transmission of data at a higher rate than full response signals which have zero amplitude at all but one of the sampling times. In addition to filtering the readback signal to condition it for most accurate detection and interpretation, other techniques, such as encoding the data, are used to enhance performance of ML detectors.

The invention presents a rate 64/65 code that imposes a (d=0, G=11/I=10) constraint on binary data. The d parameter in the constraint specifies the minimum number of 0s that must occur between two 1s in a stream of data. The G constraint specifies the maximum number of 0s that can occur between two 1s. The I constraint pertains to the two interleaves that are obtained by taking the two streams of alternating bits. I specifies the maximum number of 0s that can separate two is on one of those interleaves in which each interleave is considered separately.

The 64/65 rate indicates that the encoder takes as input a block of 64 bits and outputs a codeword of length 65 bits. The mapping from dataword to codeword must be unique so that it is invertible. The (0, G/I) constraint must be maintained not just in each codeword but in the concatenation of the codewords.

The code rate is said to increase as the efficiency approaches unity, and modulation codes having efficiencies in excess of 0.889 are called high rate codes. The motivation for the rate 64/65 code came from a prior implementation where three (0,9/9) 32/33 codewords were concatenated with three parity bits. This resulted in a rate 96/102=0.9412 code. This is the same rate that is obtained if three parity bits are added to a codeword of the 64/65 code for a total rate of 64/68. This enabled the same error detection capability and similar runlength constraints to be obtained in a code with a smaller block size.

The encoder takes as input 64 bits, or 8 bytes, of unconstrained binary data. It outputs 65 bit codewords that meet the (d=0, G=11/I=10) constraint both individually and when concatenated.

The encoding actually takes place in a number of smaller steps and is depicted in FIG. 1. Bits i through j in a word 10 are denoted as i:j. Also, the bits in byte h are denoted as $[7:0]_h$. The 17 bit codeword 30 of the 16/17 code is denoted as $[16:0]_c$.

First, the last two bytes are passed through a rate 16/17 encoder 20 in a 16-to-17 bit expansion process. FIG. 3 lists the data patterns that 16/17 eliminates in the 17 bit codeword 30. The top row lists the bit positions. The following five rows list the forbidden patterns. An 'X' signifies that the bit in that position is not specified, i.e., it can be either a 0 or a 1.

There are 67228 possible 17-bit codewords 30 that meet this constraint. Each of the $2^{16}$=65536 data words is mapped onto a unique codeword.

As shown in FIG. 1, the bits are then rearranged into an intermediate word 40 and 50. Five sets of 11 bits are then passed through an 11/11 (rate 1) encoder 60 that imposes a (0, 8/8) constraint upon its output codewords. Because of the manner in which the bits were rearranged, each of the 11 bit words input to this encoder 60 is constrained not to have its first three bits be all 1s. This constraint disallows 1/8 of unconstrained 11 bit binary words. Therefore, this results in (7/8) * $2^{11}$=1792 possible input words. There are 2048 11-bit words that meet the (0, 8/8) constraint. Each of the 1792 input words is mapped onto one unique codeword leaving 256 codewords without an input word mapped to them.

In order to obtain the final 65 bit codewords 70 and 80, the five 11-bit codewords 70 are then separated from each other by two or three uncoded, unconstrained bits 80. This increases the (0, G/I) constraint across codeword boundaries to (0, 11/10).

There were no unconstrained bits added at the beginning or end of the 65 bit codeword 70 and 80. This means that up to three unconstrained bits can be added to the end of each codeword 70 and 80 without impacting the (0, G/I) constraint. This is useful when parity bits are added to the codeword. Three parity bits can be added to each codeword resulting in a triple parity rate 64/68 code meeting the same (0, G/I) constraint.

The 16/17 encoder 20 takes an unconstrained 16 bit word as input and outputs a 17 bit word 30 which meets the constraint described in FIG. 3. The sixteen bits of the input word are denoted as x[15:0]. The seventeen bits of the output word are denoted as y[16:0]. For the encoding, indicator variables are defined as q1=x[15] & x[14] & x[13]
q2=x[12] & x[11] & x[10]
q3=x[9] & x[8] & x[7]
q4=x[6] & x[5] & x[4]

The encoding table for this code is shown in FIG. 4. The first four columns list the values of the indicator variables.

The remaining six columns list the mapping of the input bits onto the output bits as conditioned on the indicator variables.

This mapping can be expressed in terms of equations as follows.

Indicator variables:

m0=!q1 & !q2 & !q3 & !q4
m1=q1 & !q2 & !q3 & !q4
m2=!q1 & q2 & !q3 & !q4
m3=!q1 & !q2 & q3 & !q4
m4=!q1 & !q2 & !q3 & q4
m5=q1 & q2 & !q3 & !q4
m6=!q1 & q2 & q3 & !q4
m7=!q1 & !q2 & q3 & q4
m8=q1 & !q2 & q3 & !q4
m9=!q1 & q2 & !q3 & q4
m10=q1 & !q2 & !q3 & q4
m11=q1 & q2 & q3 & !q4
m12=q1 & q2 & !q3 & q4
m13=q1 & !q2 & q3 & q4
m14=!q1 & q2 & q3 & q4
m15=q1 & q2 & q3 & q4

Encoding equations:

y[16]=(x[15] & (m0↑m2|m3|m4|m6|m7|m9|m14))|(x[12] & m13)|(x[9] & (m5|m10|m12))|(x[6] & (m1|m8|m11)) |(x[3] & m15);

y[15]=(x[14] & (m0|m2|m3|m4|m6|m7|m9|m14))|(x[11] & m13)|(x[8] & (m5|m10|m12))|(x[5] & (m1|m8|m11)) |(x[2] & m15);

y[14]=(x[13] & (m0|m2|m3|m4|m6|m7|m9|m14))|(x[10] & m13)|(x[7] & (m5|m10|m12))|(x[4] & (m1|m8|m11));

y[13]=(x[12] & (m0|m1|m3|m4|m7|m8|m10))|(x[9] & m9)|(x[6] & (m2|m5|m6))|(x[6] & (m2|m5|m6))|(x[3] & (m11|m12|m13|m14));

y[12]=(x[11] & (m0|m1|m3|m4|m7|m8|m10))|(x[8] & m9)|(x[5] & (m2|m5|m6))|(x[2] & (m11|m12|m13|m14));

y[11]=(x[1O] & (m0|m1|m3|m4|m7|m8|m10))|(x[7] & m9)|(x[4] & (m2|m5|m6))|m15;

y[10]=(x[9] & (m0|m1|m2|m4))|(x[6] & (m3))|(x[3] & |m7|m8|m9))|(x[3] & m10)|(m13);

y[9]=(x[8] & (m0|m1|m2|m4))|(x[5] & (m3))|(x[2] & (m5|m6|m7|m8|m9)) |(x[3] & m10)|(m12);

y[8]=(x[7] & (m0|m1|m2|m4))|(x[4] & (m3))|(m10| (m11|m12|m13|m14|m15);

y[7]=(x[6] & (m0))|(x[3] & (m1|m2|m3))|(x[3] & (m4))| (x[2] & (m10))|(m6);

y[6]=(x[5] & (m0))|(x[2] & (m1|m2|m3))|(x[2] & (m5|m6|m7|m8|m9))|(!3] & m10)|(m12);

y[5]=(x[4] & (m0))|(m4) (m10)| (m5|m6|m7|m8|m9|m11|m12|m13|m14|m15);

y[4]=(x[3] & m0)|(x[2] & (m4))|(m3|m8);

y[3]=(x[2] & m0)|(!x[2] & (m4))|(m2|m9);

y[2]=(!m0);

y[1]=x[1];

y[0]=x[0].

Note that in the logic equations, "!" is the logical "not" function, "&" is the logical "and" function, "|" is the logical "or" function, and "^" is the logical "xor" function.

Note that the input bits x[1:0] are always mapped onto y[1:0] regardless of the values of the indicator variables.

The rate 1/11 (0, 8/8) encoder is identical to that in U.S. patent application Ser. No. 09/384,850, now U.S. Pat. No. 6,229,458, entitled "Rate 32/34 (0, 9/9) Parity Code" by S. Altekar, herein incorporated by reference.

Figure 2:
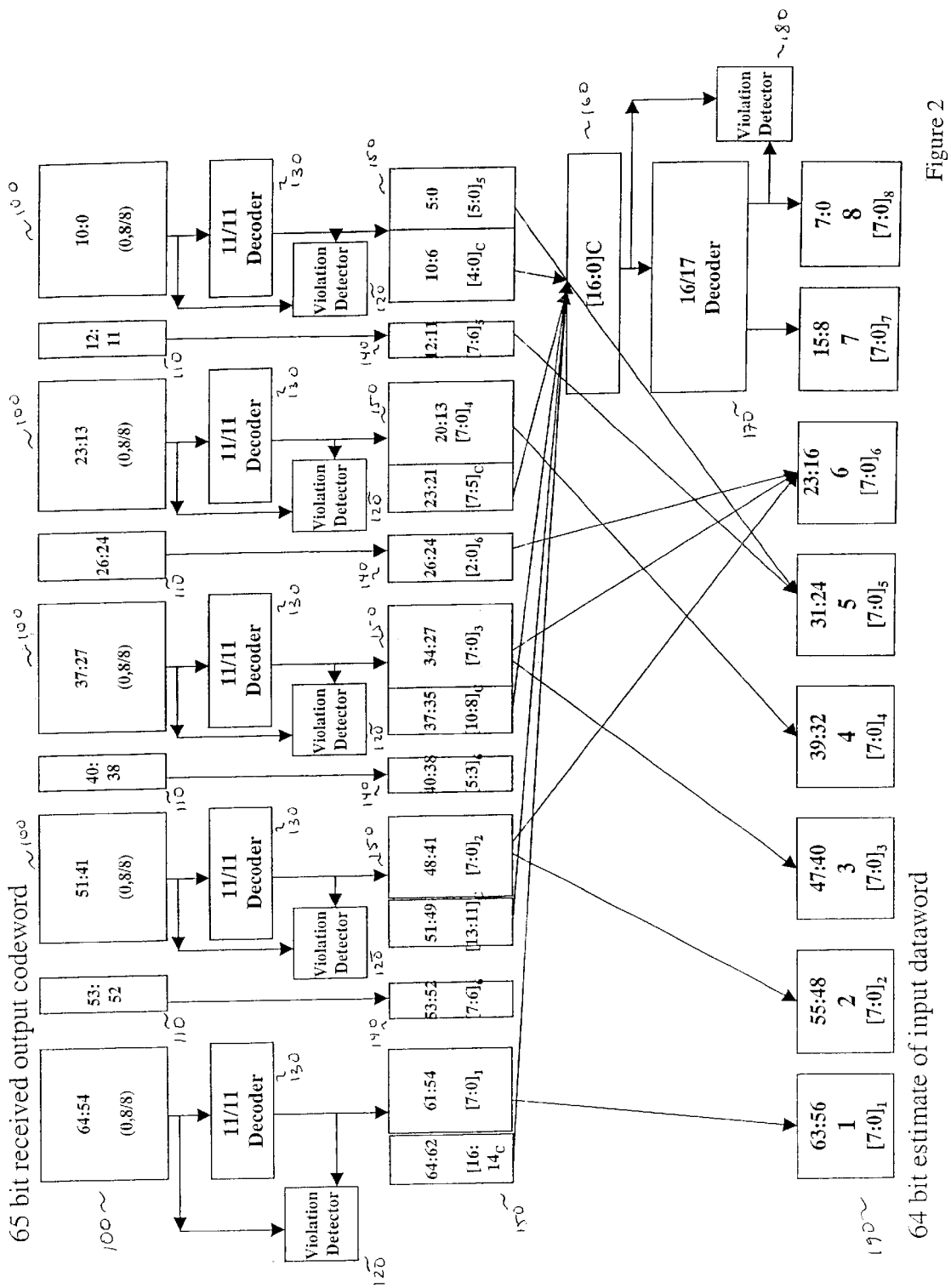
FIG. 2 illustrates a functional block diagram for a 64 bit decoder.

Like the encoding, the decoding occurs in several steps and is depicted in FIG. 2. The decoder accepts as input the 65 bit received codeword 100 and 110. It outputs the 64 bit estimated data word 190. Five blocks 100 of 11 bits are taken from the 65 bit codeword are passed through the 11/11 decoder 130. A detection violation check 120 is performed on the input and output of the codeword to verify that both are valid.

The bits are then rearranged in a 65 bit word 150 and 140. Seventeen of those bits are passed through the decoder 160 for the 16/17 code. Once again, a detection violation check 180 is performed on the input and output of the codeword to verify that both are valid. The 16-bit output 170 of this decoder 160 is then combined with the 48 other bits to form the estimate of the 64 bit dataword.

The decoder 130 for the 11/11 code is once again the same as that in U.S. application Ser. No. 09/384,850, now U.S. Pat. No. 6,229,458, entitled "Rate 32/34 (0, 9/9) Parity Code" by S. Altekar, herein incorporated by reference.

The detection violation flag is raised in two situations. First, it is raised if the input 11 bit codeword is a violation of the (0, 8/8) code constraint. Second, the on flag is raised when any codeword that is not all zeros is input to the decoder all 0 dataword is output. The reason for this is that the decoder maps any unassigned codeword to the all 0 word. However, only the all 0 input word is encoded, and therefore uniquely mapped to the all 0 codeword by the 11/11 encoder.

This decoder 170 undoes the operation performed by the 16/17 encoder 20 in a 17-to-16 bit decompression process and, thus, undoes the mapping shown in FIG. 1. accomplished by the following equations.

Indicator Variables:

m0=!y[2];
m1=!y[5] & !y[4] & !y[3] & y[2];
m2=!y[5] & !y[4] & y[3] & y[2];
m3=!y[5] & y[4] & !y[3] & y[2];
m4=(y[7] ^ y[6]) & y[5] & (y[4] ^ y[3]) & y[2];
m5=!y[8] & !y[7] & !y[6] & y[5] & !y[4] & !y[3] & y[2];
m6=y[8] & y[7] & !y[6] & y[5] & !y[4] & !y[3]& y[2];
m7=!y[8] & !y[7] & y[6] & y[5] & !y[4] & !y[3] & y[2];
m8=!y[8] & !y[7] & !y[6] & y[5] & y[4] & !y[3] & y[2];
m9=!y[8] & !y[7] & !y[6] & y[5] & !y[4] & y[3] & y[2];
m10=(y[10] ^ y[9]) & y[8] & (y[7] ^ y[6]) & y[5] & !y[4] & !y[3] & y[2];
m11=!y[11] & !y[10] & !y[9] & y[8] & !y[7] & !y[6] & y[5] & !y[4] & !y[3] & y[2];
m12=!y[11] & !y[10] & y[9] & y[8] & !y[7] & !y[6] & y[5] & !y[4] & !y[3] & y[2];
m13=!y[11] & y[10] & !y[9] & y[8] & !y[7] & !y[6] & y[5] & !y[4] & !y[3] & y[2];
m14=!y[11] & !y[10] & !y[9] & y[8] & !y[7] & y[6] & y[5] & !y[4] & ![3] & y[2];
m15=!y[14] & !y[13] & !y[12] & y[11] & !y[10] & !y[9] & y[8] !y[7] & !y[6] & y[5] & !y[4] & !y[3] & y[2].

Decoding:

x[15]=(y[16] & (m0|m2|m3|m4|m6|m7|m9|m14))| (m1|m5|m8|m10|m11|m12|m13|m15);

x[14]=(y[15] & (m0|m2|m3|m4|m6|m7|m9|m14))| (m1|m|m8|m10|m11|m12|m13|m15);

x[13]=(y[14] & (m0|m2|m3|m4|m6|m7|m9|m14))|
(m1|m5|m8|m10|m11|m12|m13|m15);

x[12]=(y[16] & (m13))|(y[13] & (m0|m1|m3|m4|m7|m8|m10))|
(m2|m5|m6|m9|m11|m12|m14|m15);

x[11]=(y[15] & (m13))|(y[12] & (m0|m1|m3|m4|m7|m8|m10))|
(m2|m5|m6|m9|m11|m12|m14|m15);

x[10]=(y[14] & (m13))|(y[11] & (m0|m1|m3|m4|m7|m8|m10))|
(m2|m5|m6|m9|m11|m12|m14|m15);

x[9]=(y[16] & (m5|m10|m12))|(y[13] & (m9))|(y[10] & (m0|m1|m2|m4))|(m3|m6|m7|m8|m11|m13|m14|m15);

x[8]=(y[15] & (m5|m10|m12))|(y[12] & (m9))|(y[9] & (m0|m1|m2|m4))|(m3|m6|m7|m8|m11|m13|m14|m15);

x[7]=(y[14] & (m5|m10|m12))|(y[11] & (m9))|(y[8] & (m0|m1|m2|m4))|(m3|m6|m7|m8|m1|m13|m14|m15);

x[6]=(y[16] & (m1|m8|m11))|(y[13] & (m2|m5|m6))|(y[10] & (m3))|(y[7] & (m0))|
(m4|m7|m9|m10|m12|m13|m14|m15);

x[5]=(y[15] & (m1|m8|m11)) (y[12] & (m2|m5|m6))|(y[9] & (m3))|(y[6] & (m0))|
(m4|m7|m9|m10|m12|m13|m14|m15);

x[4]=(y[14] & (m1|m8|m11))|(y[11] & (m2|m5|m6))|(y[8] & (m3))|(y[5] & (m0))|
(m4|m7|m9|m10|m12|m13|m14|m15);

x[3]=(y[16] & (m15))|(y[13] & (m11|m12|m13|m14))|(y[10] & (m5|m6|m7|m8|m9))|(y[7] & m1|m2|m3))|(y[4] & (m0))|(y[10] & (m10))|(y[7] & (m4));

x[2]=(y[15] & (m15))|(y[12] & (m11|m12|m13|m14))|(y[9] & (m5|m6|m7|m8|m9))|(y[6] & m1|m2|m3))|(y[3] & (m0))|(y[7] & (m10))|(y[4] & (m4));

x[1]=y[1];
x[0]=y[0].

As in the 11/11 case, the detection violation flag is raised in two situations to provide an indication that the received codeword does not correspond to a valid data sequence since errors and/or noise may have corrupted the codeword. First, it is raised if the input 65 bit codeword is a violation of the (0, 11/10) code constraint. Second, the violation flag is raised when the all 0 dataword is output by the decoder and any 17 bit codeword that is not all 0s is input to the decoder. Any unassigned (0, 11/10) codeword is decoded by the decoder as the all 0 word. However, the only data word that is mapped onto the all 0 codeword is the all 0 input word. Therefore, if the decoder outputs an all 0 word when a 17 bit word that was not all zeros was input, an invalid codeword must have been received.

The error correcting code is often implemented such that four code words are interleaved in the actual data stream. For example, the recorded pattern might be (byte 1, codeword 1), (byte 1, codeword 2), (byte 1, codeword 3), (byte 1, codeword 4), (byte 2, codeword 1), etc. The reason for this is that each code word can only correct a fixed number of bytes in error. So, if a burst error occurs corrupting several consecutive bytes, it is better for it to be spread out over several codewords. In other words, a byte or two in error in each of the four codewords will be correctable, but five bytes in error in one codeword can cause errors in the user data which is unacceptable.

When this code is used with an error correction code (ECC) system that employs 4-way interleaving, a byte shuffler should be used to minimize the amount of error propagation within a single interleave.

The byte shuffler works to minimize the impact that an error in one or more consecutive 65 bit codewords will have on a 4-way interleaved ECC system. An error in such a codeword would propagate to corrupt several bytes at the output of the 65/64 decoder. The output of this decoder would then be fed into the decoder for the ECC. The byte shuffler attempts to make sure that too many of the errors propagated by the 65/64 decoder do not end up in the same interleave of the ECC.

The byte shuffler operates on 64 bit words before sending them to the 64/65 encoder. Before these bytes are encoded by the 64/65 encoder, they are rearranged. There are four different shuffling patterns that are used. As sequential 8 byte words are rearranged, rotation through the four different shuffling methods is performed. Therefore, four consecutive 8 byte datawords would each encounter a different shuffling pattern and the fifth such 8 byte word would have the same shuffling pattern as the first.

FIG. 5 demonstrates how the byte shuffling works. The eight bytes at the output of the scrambler are labeled as 76543210.

A state variable is used to show which shuffling pattern is to be used. The state variable is reset at the beginning of each sector. It is incremented with each shuffling and reset to 0 after the fourth shuffling.

A byte deshuffler must be inserted in the read path in order to undo the byte shuffling in the write path. The byte deshuffler takes the 64 bit word at the output of the decoder, and rearranges the bytes. The goal of the deshuffler is to make sure that the order of the final estimated user bytes are the same as the original user bytes.

FIG. 6 shows the rotation through the different deshuffling patterns. The eight bytes at the output of the 65/64 decoder are labeled as 76543210.

Once again, a state variable is used to show which shuffling pattern is to be used. The state variable is reset at the beginning of each sector. It is incremented with each received codeword and reset to 0 after each fourth deshuffling.

It is important to minimize the amount of error propagation that occurs when an error in the received codeword goes through the decoder. The propagation that does occur can be seen by positioning errors in the 65 bit received codeword and following them through the decoder in FIG. 2 to find which bytes of the estimated data word have been corrupted. In addition, because many ECC systems are implemented on a 4-way interleave of the data, the number of resulting bytes of error in each of the 4-way interleaves is important to overall system performance.

Close examination of FIG. 2 show that an 11-bit error that occurs within a single codeword will result in at most 5 bytes of error. No more than two of these bytes can be in the same 4-way interleave.

As this code can be used in systems with a post processor, it is important to consider what happens when an error in one position is miscorrected by the post processor as an error in another position. In the worst case, an error occurring over the boundary with the previous codeword is miscorrected as an error occurring on the boundary with the subsequent codeword. With this code, one such 11 bit error miscorrected as another 11 bit error results in a total of 10 bytes of error. However, by employing the byte shuffling scheme, it is possible to make sure that no more than three bytes are in any one of four interleaves.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the rate 64/65 (d=0, G=11/I=10) run length limited modulation code of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A method for encoding a sequence of r bit digital data words into a sequence of codewords, comprising;

encoding a first portion of the r bit digital data word to form a first set of encoded bits;

encoding a second portion of the r bit digital data word and the first set of encoded bits to form a second set of encoded bits, a third portion of the r bit digital data word being uncoded and unconstrained; and joining the third portion of the r bit digital data word and the second set of encoded bits to form a codeword.

2. A method for encoding a sequence of r bit digital data words into a sequence of codewords having (r+1) bits, comprising:

dividing each r bit digital data word into a first n-bit byte, a second n-bit byte, and a remainder of m other n-bit bytes;

encoding the first and second n-bit bytes to form a (2n+1)-bit word;

forming p k-bit intermediate blocks from the (2n+1)-bit word and a portion of the m other n-bit bytes, a remainder of the m other n-bit bytes including uncoded and unconstrained bits;

encoding the p k-bit intermediate blocks; and concatenating the p encoded k-bit intermediate blocks and the uncoded and unconstrained bits to form a (r+1) bit codeword.

3. The method of claim 2, the (r+1) bit codeword satisfies a predetermined minimum zero run length (d) constraint, a predetermined maximum zero run length (G) constraint, and a predetermined maximum interleave zero run length (I) coding constraint, wherein the constraints hold both for concatenated intermediate blocks and for no intermediate blocks.

4. The method of claim 3, wherein the (2n+1)-bit word is prohibited from containing certain bit patterns.

5. The method of claim 4, wherein the certain bit patterns include words with a "111" pattern at certain bit positions.

6. The method of claim 3, wherein r=64.

7. The method of claim 6, wherein n=8, k=11, and p=5.

8. The method of claim 7, wherein the uncoded and unconstrained bits are placed between each pair of adjacent ones of the p encoded k-bit intermediate blocks.

9. The method of claim 8, wherein one or more parity bits are concatenated to the (r+1) bit codeword.

10. The method of claim 9, wherein three parity bits are concatenated to the (r+1) bit codeword.

11. The method of claim 2, wherein the (2n+1) bit word is a 17 bit word described as y[16:0] and the two n-bit bytes are two 8-bit bits described as bits x[15:0], wherein the 17 bit word is determined by the following the logical relationships:

q1=x[15] & x[14] & x[13];
q2=x[12] & x[11] & x[10];
q3=x[9] & x[8] & x[7];
q4=x[6] & x[5] & x[4];
m0=!q1 & !q2 & !q3 & !q4;
m1=q1 & !q2 & !q3 & !q;
m2=!q1 & q2& !q3 & !q4,
m3=!q1 & !q2 & q3 & !q4;
m4=!q1 & !q2 & !q3 & q4;
m5=q1 & q2 & !q3 & !q4;
m6 !q1 & q2 & q3 & !q4;
m7=!q1 & !q2 & q3 & q4;
m8=q1 & !q2 & q3 & !q4;
m9=!q1 & q2 & !q3 & q4;
m10=q1 & !q2 & !q3 & q4;
m11=q1 & q2 & q3 & !q4;
m12=q1 & q2 & !q3 & q4;
m13=q1 & !q2 & q3 & q4;
m14=!q1 & q2 & q3 & q4;
m15=q1 & q2 & q3 & q4;
y[16]=(x[15] & (m0|m2|m3|m4|m6|m7|m9|m14))|(x[12] & m13)|(x[9] & (m5|m10|m12))|(x[6] & (m1|m8|m11))|(x[3] & m15);
y[15]=(x[14] & (m0|m2|m3|m4|m6|m7|m9|m14))|(x[11] & m13)|(x[8] & m5|m10|m12))|(x[5] & (m1|m8|m11))|(x[2] & m15);
y[14] (x[13] & (m0|m2|m3|m4|m6|m7|m9|m14))|(x[10] & m13)|(x[7] & (m5|m10|m12))|(x[4] & (m1|m8|m11));
y[13]=(x[12] & (m0|m1|m3|m4|m7|m8|m10))|(x[9] & m9)|(x[6] & (m2|m5|m6))|(x[6] & (m2|m5|m6))|(x[3] & (m11|m12|m13|m14));
y[12]=(x[11] & (m0|m1|m3|m4|m7|m8|m10))|(x[8] & m9) 1 (x[5] & (m2|m5|m6))|(x[2] & (m11|m12|m13|m14));
y[11]=(x[10] & (m0|m1|m3|m4|m7|m8|m10))|(x[7] & m9)|(x[4] & (m2|m5|m6))|m15;
y[10]=(x[9] & (m0|m1|m2|m4))|(x[6] & (m3))|(x[3] & (m5|m6|m7|m8|m9))|(x[3] & m10)|(m13);
y[9]=(x[8] & (m0|m1|m2|m4))|(x[5] & (m3))|(x[2] & (m5|m6|m7|m8|m9))|(x[3] & m10)|(m12);
y[8]=(x[7] & (m0|m|m2|m4))|(x[4] & (m3))|(m10|(m11|m12|m13|m14|m15);
Y[7]=(x[6] & (m0))|(x[3] & (m1|m2|m3))|(x[3] & (m4))|(x[2] & (m10))|(m6);
y[6]=(x[5] & (m0))|(x[2] & (m1|m2|m3))|(x[2] & (m5|m6|m7|m8|m9))|(!x[3] & m10)|(m12);
y[5]=(x[4] & (m0))|(m4)|(m10)|(m5|m6|m7|m8|m9|m11|m12|m13|m14|m15);
y[4]=(x[3] & m0) (x[2] & (m4))|(m3|m8);
y[3]=(x[2] & m0)|(!x[2] & (m4))|(m2|m9);
y[2]=(!m0);
y[1]=x[1]; and
y[0]=x[0].

12. An encoder for encoding an r bit digital data word into a (r+1) bit codeword, the r bit digital data word formed of n-bit bytes, comprising:

a first stage for encoding 2*n bits to form (2n+1) encoded bits, where r>2*n; and a second stage for encoding the (r−2*n) remaining bits and the (2n+1) encoded bits to form a (r+1) bit codeword, wherein the encoding is done according to the method of claim 11.

13. The encoder of claim 12, wherein a byte shuffler rearranges the order of the n-bit bytes of the r-bit digital data word before the r-bit digital data word is processed by the first stage of the encoder.

14. The method of claim 2, wherein the n-bit bytes are rearranged by a byte shuffler before encoding.

15. The method of claim 2, wherein the n-bit bytes are rearranged by a byte shuffler before encoding.

16. The method of claim 2, in which the (r+1) bit codeword satisfying a predetermined minimum zero run length (d) constraint, a predetermined maximum zero run length (G) constraint, and a predetermined maximum interleave zero run length (I) coding constraint, the constraints holding both for concatenated intermediate blocks and for no intermediate blocks.

17. The method of claim 16, in which d=0, G=11, and I=10.

18. A method for encoding a sequence of r bit digital data words into a sequence of codewords having (r+1) bits, comprising:

dividing each r bit digital data word into n-bit bytes;

encoding two n-bit bytes to form a (2n+1)-bit word;

forming p k-bit intermediate blocks from the n-bit bytes;

encoding the p k-bit intermediate blocks; and concatenating the p encoded k-bit intermediate blocks and uncoded and unconstrained bits from the r bit digital data word to form a (r+1) bit codeword, the (r+1) bit codeword satisfying a predetermined minimum zero run length (d) constraint, a predetermined maximum zero run length (G) constraint, and a predetermined maximum interleave zero run length (I) coding constraint, in which d=0, G=11, and I=10, the constraints holding both for concatenated intermediate blocks and for no intermediate blocks.

19. A method for decoding a sequence of (r+1) bit encoded codewords into a sequence of r bit digital data words bits, comprising:

dividing the (r+1) bit encoded codeword into p k-bit intermediate blocks and unconstrained and uncoded bits;

decoding the p k-bit intermediate blocks separately;

decoding (2n+1) bits of the p k-bit intermediate blocks to form two n-bit bytes; and dividing each of remaining (r−2n) bits from both the decoded p k-bit intermediate blocks and the unconstrained and uncoded bits into t n-bit bytes.

20. The method of decoding of claim 19, wherein t=6.

21. The method of claim 20, wherein r=64, n=8, k=11, and p=5.

22. The method of claim 21, further comprising checking the (2n+1) encoded word by a violation checker.

23. The method of claim 22, wherein a violation occurs when the (2n+1) encoded word is not equal to zero and the decoded word 2 n-bit bytes are all zero.

24. The method of claim 21, wherein the (2n+1) bit word is a 17 bit word described as y[16:0] and the two n-bit bytes are two 8-bit bits described as bits x[15:0], wherein the 16 bit word is determined by the following the logical relationships:

m0=!y[2];
m1=!y[5] & !y[4] & !y[3] & y[2];
m2=!y[5] & !y[4] & y[3] & y[2];
m3=!y[5] & y[4] & !y[3] & y[2];
m4 =(y[7] ˆ y[6]) & y[5] & (y[4] ˆ y[3]) & y[2];
m5=!y[8] & !y[7] & !y[6] & y[5] & !y[4] & !y[3] & y[2];
m6=!y[8] & y[7] & !y[6] & y[5] & !y[4] & !y[3] & y[2];
m7=!y[8] & !y[7] & y[6] & y[5] & !y[4] & !y[3] & y[2];
m8=!y[8] & !y[7] & !y[6] & y[5] & y[4] & !y[3] & y[2];
m9=!y[8] & !y[7] & !y[6] & y[5] & !y[4] & y[3] & y[2];
m10=(y[10] ˆ y[9]) & y[8] & (y[7] ˆ y[6]) & y[5] & !y[4] & !y[3] & y[2];
m11=!y[11] & !y[10] & !y[9] & y[8] & !y[7] & !y[6] & y[5] & !y[4] & !y[3] & y[2];
m12=!y[11] & !y[10] & y[9] & y[8] & !y[7] & !y[6] & y[5] & !y[4] & !y[3] & y[2];
m13=!y[11] & y[10] & !y[9] & y[8] & !y[7] & !y[6] & y[5] & !y[4] & !y[3] & y[2];
m14=!y[11] & !y[10] & !y[9] & y[8] & !y[7] & y[6] & y[5] & !y[4] !y[3] & y[2];
m15=!y[14] & !y[13] & !y[12] & y[11] & !y[10] & !y[9] & y[8] & !y[7] & !y[6] & y[5] & !y[4] & !y[3] & y[2];

x[15]=(y[16] & (m0|m2|m3|m4|m6|m7|m9|m14))|(m1|m5|m8|m10|m11|m12|m13|m15);

x[14]=(y[15] & (m0|m2|m3|m4|m6|m7|m9|m14))|(m1|m5|m8|m10|m11|m12|m13|m15);

x[13]=(y[14] & (m0|m2|m3|m4|m6|m7|m9|m14))|(m1|m5|m8|m10|m11|m12|m13|m15);

x[12]=(y[16] & (m13))|(y[13] & (m0|m1|m3|m4|m7|m8|m10))|(m2|m5|m6|m9|m11|m12|m14|m15);

x[11]=(y[15] & (m13))|(y[12] & (m0|m1|m3|m4|m7|m8|m10))|(m2|m5|m6|m9|m11|m12|m14|m15);

x[10]=(y[14] & (m13))|(y[11] & (m0|m1|m3|m4|m7|m8|m10))|(m2|m5|m6|m9|m11|m12|m14|m15);

x[9]=(y[16] & (m5|m10|m12))|(y[13] & (m9))|(y[10] & (m0|m1|m2|m4))|(m3|m6|m7|m8|m1|m13|m14|m15);

x[8]=(y[15] & (m5|m10|m12))|(y[12] & (m9))|(y[9] & (m0|m1|m2|m4))|(m3|m6|m7|m8|m11|m13|m14|m15);

x[7]=(y[14] & (m5|m10|m12))|(y[11] & (m9))|(y[8] & (m0|m1|m2|m4))|(m3|m6|m7|m8|m11|m13|m14|m15);

x[6]=(y[16] & (m1|m8|m11))|(y[13] & (m2|m5|m6))|(y[10] & (m3))|(y[7] & (m0))|(m4|m7|m9|m10|m12|m13|m14|m15);

x[5]=(y[15] & (m1|m8|m11))|(y[12] & (m2|m5|m6))|(y[9] & (m3))|(y[6] & (m0))|(m4|m7|m9|m10|m12|m13|m14|m15);

x[4]=(y[14] & (m1|m8|m11))|(y[11] & (m2|m5|m6))|(y[8] & (m3))|(y[5] & (m0))|(m4|m7|m9|m10|m12|m13|m14|m15);

x[3]=(y[16] & (m15))|(y[13] & (m11|m12|m13|m14))|(y[10] & (m5|m6|m7|m8|m9))|(y[7] & m |m2|m3))|(y[4] & (m0))|(y[10] & (m10)) (y[7] & (m4));

x[2]=(y[15] & (m15))|(y[12] & (m11|m12|m13|m14))|(y[9] & (m5|m6|m7|m8|m9))|(y[6] & m1|m2|m3))|(y[3] & (m0))|(y[7] & (m10))|(y[4] & (m4));

x[1]=y[1]; and
x[0]=y[0].

25. A decoder for decoding an (r+1) bit codeword into an r bit digital data word, the r bit digital data word formed of n-bit bytes, comprising:

a first stage for decoding (2*n+1) bits to form 2*n encoded bits, where r>2*n; and a second stage for decoding the (r−2*n) remaining bits and the 2*n decoded bits to form an r bit digital data word, wherein the decoding is done according to the method of claim 24.

26. The decoder of claim 25, wherein a byte deshuffler rearranges the order of the n-bit bytes of the r-bit digital data word after the r-bit digital data word is processed by the second stage of the decoder.

27. The method of claim 19, wherein, if the n-bit bytes had been rearranged by a byte shuffler before encoding, then rearranging the n-bit bytes using a byte deshuffler.

28. A method for decoding a sequence of 65 bit encoded codewords into a sequence of 64 bit digital data words bits, comprising:

dividing a 65 bit encoded codeword into five 11-bit intermediate blocks and unconstrained and uncoded bits;

decoding the five 11-bit intermediate blocks separately;

dividing the five 11-bit intermediate blocks into a 17 bit section and a 38 bit section, decoding 17 bits of the 17 bit section to form two 8-bit bytes; and dividing the 38 bit section and the unconstrained and uncoded bits into six 8-bit bytes.

29. The method of claim 28, wherein 4-way error correction code interleaving is used.

30. The method of claim 29, wherein byte shuffling is used.

* * * * *